US00RE39778E

(19) United States
(12) Reissued Patent
Kawase et al.

(10) Patent Number: US RE39,778 E
(45) Date of Reissued Patent: Aug. 21, 2007

(54) METHOD OF PREPARING GROUP III-V COMPOUND SEMICONDUCTOR CRYSTAL

(75) Inventors: Tomohiro Kawase, Hyogo (JP); Masami Tatsumi, Hyogo (JP)

(73) Assignee: Sumitomo Electric Industries, Ltd., Osaka (JP)

(21) Appl. No.: 09/824,965

(22) Filed: Apr. 3, 2001

Related U.S. Patent Documents

Reissue of:
(64) Patent No.: 6,007,622
Issued: Dec. 28, 1999
Appl. No.: 08/843,124
Filed: Apr. 25, 1997

(30) Foreign Application Priority Data

Apr. 26, 1996 (JP) ..... 8-107009

(51) Int. Cl.
*C30B 11/04* (2006.01)

(52) U.S. Cl. ..... 117/82; 117/83; 117/4; 117/6; 117/7; 117/953

(58) Field of Classification Search ..... 117/4, 117/6, 7, 82, 953, 83
See application file for complete search history.

(56) References Cited

U.S. PATENT DOCUMENTS

| | | | |
|---|---|---|---|
| 4,083,748 | A | 4/1978 | Gault |
| 4,404,172 | A | 9/1983 | Gault |
| 4,478,675 | A | 10/1984 | Akai |

(Continued)

FOREIGN PATENT DOCUMENTS

| | | | |
|---|---|---|---|
| EP | 0 417 843 | A2 | 3/1991 |
| EP | 0529963 | B1 | 8/1992 |
| EP | 0529963 | * | 3/1993 |
| JP | 59-054699 | | 3/1984 |
| JP | 60-210599 | * | 10/1985 |
| JP | 01037833 | * | 2/1989 |
| JP | 64-37833 | | 2/1989 |
| JP | 64-79087 | * | 3/1989 |
| JP | 02034597 | * | 2/1990 |
| JP | 2-74597 | * | 3/1990 |
| JP | 3-252399 | * | 11/1991 |
| JP | 04-104989 | | 4/1992 |
| JP | 06-128096 | | 5/1994 |

OTHER PUBLICATIONS

Journal of Japanese Association of Crystal Growth, Y. Okabe et al, Undoped Semi–Insulating GaAs Single Crystals Grtown by the VGF Method vol. 18, 1991 pp. 88–95.*

Kawase, T. "Low disloaction density and low residual strain semi–insulating GaAs grown by vertical boat method"., Apr. 1996.*

Frank, Ch., et al., "Description of Facet Growth During BGF Growth," Cryst. Res. Technol., 29 (1994)1, pp. K12–16.

Frank C., et al., "Growth of Semiinsulating GaAs Crystsals by Vertical Graident Freez Technique," Cryst. Res. Technol., 30 (1995) 7, pp. 897–909.

(Continued)

*Primary Examiner*—Robert Kunemund
(74) *Attorney, Agent, or Firm*—Fish & Richardson P.C.

(57) ABSTRACT

A method is provided for preparing, with high reproducibility, a carbon-doped group III–V compound semiconductor crystal having favorable electrical characteristics and having impurities removed therefrom, and in which the amount of doped carbon can be adjusted easily during crystal growth. This method includes the steps of: filling a crucible with compound raw material, solid carbon, and boron oxide; sealing the filled crucible within an airtight vessel formed of a gas impermeable material; heating and melting the compound raw material under the sealed state in the airtight vessel; and solidifying the melted compound raw material to grow a carbon-doped compound semiconductor crystal.

77 Claims, 7 Drawing Sheets

U.S. PATENT DOCUMENTS

| | | | | | |
|---|---|---|---|---|---|
| 4,521,272 | A | | 6/1985 | Gault | |
| 4,678,534 | A | | 7/1987 | Tada et al. | |
| 4,923,561 | A | | 5/1990 | Chemans et al. | |
| 4,946,544 | A | | 8/1990 | Ejim | |
| 4,999,082 | A | * | 3/1991 | Kremer et al. | 252/62.3 GA |
| 5,041,186 | A | | 8/1991 | Nishio et al. | |
| 5,131,975 | A | * | 7/1992 | Bourret-Courchesne | 117/82 |
| 5,145,550 | A | | 9/1992 | Tada et al. | |
| 5,186,784 | A | | 2/1993 | Rau et al. | |
| 5,256,381 | A | | 10/1993 | Tada et al. | |
| 5,259,916 | A | | 11/1993 | Rau et al. | |
| 5,342,475 | A | | 8/1994 | Yoshida et al. | |
| 5,387,544 | A | | 2/1995 | Hayafuji | |
| 5,400,742 | A | | 3/1995 | Nishio et al. | |
| 5,415,125 | A | | 5/1995 | Fujita et al. | |
| 5,454,346 | A | | 10/1995 | Uchida et al. | 117/13 |
| 5,471,945 | A | | 12/1995 | Nishio et al. | |
| 5,515,810 | A | * | 5/1996 | Yamashita | 117/17 |

OTHER PUBLICATIONS

Bourret, E.D., et al., "Effects of Total Liquid Encapsulation on the Characteristics of GaAs Single Crystals Grown . . . ," J. Cryst. Gr. 11 (1991), pp. 395–404.

Hein, K., et al. "Die Kristasllisation aus Schmelzen als metallurgischer ProzeB," Metall, 47, Jahrgang, Heft 10, Oct. 1993.

Flade, et al. "Etwicklung grossflachiger GaAs–Substrate," Freiberger, Jun. 20, 1995.

Marshall et al., "A novel technique to reduce the concentration of Carbon in LEC gallium arsenide," J. Crys. Growth, 110 (1991), pp. 960–962.

Dissertation of Christian Frank, 1995, Technische Universitat–Bergakademie Freiberg (D4A Catalogue Data re Publication Year) (Partial Translation).

Diploma paper Matthias Muller, Sep. 15, 1993, Universitat Erlangen–Numberg (D5A Letter re Publication Date) (Partial Translation).

Parsey, "Relative virtues of different growth techniques" in Semi–Insulating III–V Materials. 1988.

Doering et al, "Carbon incorporation into LEC GaAs" in Semi–Insulating III–V Materials. 1990.

Müller et a;l. "Current issues in bulk growth of s.i. III–V materials" in Semi–Insulating III–V Materials, 1992.

Doering et al., "Carbon Incorporation Into LEC GaAs. Int. Conf. Semi–conducting and Semi–Insulating GaAs." Malmö, Sweden (1984).

Desnica et al., "Distribution coefficient of carbon in gallium arsenide," Inst. Phys. Conf. Ser. No. 83, ch. 2, pp. 33–38 (1986).

Desnica et al., "Distribution coefficient of carbon in melt–grown GaAs," J. Appl. Phys. 62(9) (Nov. 1, 1987).

Kawase et al., "Low–dislocation–density and Low residual–strain Semi–insulating GaAs Grown by VB Method," 9$^{th}$ Conf. on Semiconducting & Insulating Mat'ls—Abstracts, title, contents and p. 47 (Apr. 29–May 3, 1996).

Kawase et al., "Low–dislocation–density and Low–residual–strain Semi–insulating GaAs Grown by Vertical Boat Method," 9$^{th}$ Conf. on Semiconducting & Insulating Mat'ls—Proceedings, title, pp. ii–iii, vii–viii, xv, 275–278 (1996).

Letter, Charles W. Bradley to John B. Pegram, Jan. 29, 2003 (1 p.).

Declaration of Hunter D. Marshall, undated (5 pp.).

H.D. Marshall & D.W. DeCuir; "A novel technique to reduce the concentration of carbon in LEC gallium arsenide"; pp. 960–962 of Journal of Crystal Growth 110 (1991) North Holland.

Influence of Melt Preparation on Residual Impurity Concentration in Semi–Insulating LEC GaAs, Johji Nishio and Kazutaka Terashima, Journal of Crystal Growth 96 (1989) 605–608, North–Holland, Amsterdam.

Hein, "Growth of Semiinsulating GaAs Crystals by Vertical Gradient Freeze Technique," Crystal Research Technology v. 30, No. 7, pp. 897–909 (1995).

Hein et al, "Die Kristallisation and Schmelzen aus metallurgischer Prozess," Metall, v. 47, No. 10, pp. 924–928 (Oct. 1993).

Flade, "Entwicklung gross flächriger GaAs–Substrate," Freiberger Elektronikwerkstoffe GmbH (Hannover, Germany, Feb. 19, 1996) (?).

* cited by examiner

METHOD OF PREPARING GROUP III-V COMPOUND SEMICONDUCTOR CRYSTAL

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method of preparing a group III–V compound semiconductor crystal, and particularly a carbon-doped group III–V compound semiconductor crystal.

2. Description of the Background Art

Conventionally, there are various prior art methods for preparing a carbon-doped group III–V compound semiconductor crystal, as set forth in the following described publications.

Japanese Patent Laying-Open No. 64-79087 (referred to as "prior art 1" hereinafter) discloses a method of preparing a carbon-doped GaAs single crystal according to the gradient freeze method for horizontal Bridgman method (HB method). FIG. 6 is a diagram for describing a method of preparing a carbon-doped GaAs single crystal according to prior art 1. Referring to FIG. 6, a graphite boat 51 as a carbon source is arranged at one side in a quartz ampoule 55. Raw material which is gallium (Ga) 52 is provided in graphite boat 51. Arsenic (As) 57 is provided at the other side in quartz ampoule 55. Quartz ampoule 55 is sealed in vacuum and then installed in an electric furnace to be heated. After the GaAs raw material is synthesized, the temperature is reduced maintaining a constant temperature gradient, whereby a GaAs single crystal is grown.

The carbon of graphite boat 51 reacts with oxygen supplied from $As_2O_3$, $Ga_2O$ and the like remaining in quartz ampoule 55 to result in the formation of gas of CO, $CO_2$ and the like which is doped into the growing GaAs crystal. It is described that the doping amount of carbon can be controlled according to the total amount of oxygen in the sealed quartz ampoule 55, the synthesization reaction condition, or single crystal growth condition, and the like.

The Journal of the Japanese Association of Crystal Growth, 1991, Vol. 18, No. 4, pp. 88–95 (referred to as "prior art 2" hereinafter) discloses a method of preparing a carbon-doped GaAs single crystal by the vertical gradient freeze method (VGF method). FIG. 7 is a diagram for describing a method of preparing a carbon-doped GaAs single crystal according to prior art 2. Referring to FIG. 7, raw material 62 which has carbon doped therein in advance, and which was directly synthesized by the LEC method, and boron oxide ($B_2O_3$) 64 are provided in a crucible 61 and sealed in vacuum in a quartz ampoule 65. This is installed in a vertical furnace and heated to melt the raw material and boron oxide. By reducing the temperature in the furnace while maintaining a constant temperature gradient, a GaAs single crystal is grown.

Here, boron oxide containing 200 ppm of water spreads around only the periphery of the upper surface of GaAs melt 62. The center area of the upper surface of GaAs melt 62 is exposed to the ambient. According to the method of prior art 2, the upper surface of the melt must be exposed to the ambient to control the stoichiometry of the GaAs melt. The vapor pressure in quartz ampoule 65 is controlled by arsenic 67.

According to this method, the carbon concentration of the crystal depends on the carbon concentration of the raw material. U.S. Pat. No. 4,999,082 (referred to as "prior art 3" hereinafter) discloses a method of preparing a carbon-doped GaAs single crystal by the vertical Bridgman method. (VB method) FIG. 8 is a diagram for describing a method of preparing a carbon-doped GaAs single crystal according to prior art 3.

Referring to FIG. 8, a crucible 71 is filled with GaAs raw material 72. After carbon source 73 is arranged outside of crucible 71, a quartz ampoule 75 is sealed. Quartz ampoule 75 is placed in a vertical furnace and heated to melt the raw material. The furnace is moved upwards while substantially maintaining the set temperature profile. By solidifying the raw material from a seed crystal 77, a GaAs single crystal is grown. According to this method, carbon source 73 is in fluid communication with compound raw material 72 to allow gas transfer.

Japanese Patent Laying-Open No. 3-252399 (referred to as "prior art 4" hereinafter) discloses a method of preparing a semi-insulating GaAs substrate. Prior art 4 is characterized in that the impurity which becomes the acceptor is doped so as to result in $1\sim3\times10^{15}$ atoms/cm$^3$ after subtracting the concentration of the impurity which becomes the donor in a GaAs crystal.

Japanese Patent Laying-Open No. 2-74597 (referred to as "prior art 5" hereinafter) discloses a chromium-doped semi-insulating GaAs single crystal and a method of preparing the same. This prior art 5 is characterized in that carbon is contained in a concentration $n_c$ that satisfies both the relations of:

$$1\times10^{15}\text{cm}^{-3}\leqq n_c<n_{si} \text{ and } n_{si}-n_c\leqq4.4\times10^{15}\text{cm}^{-3}$$

for the residual Si concentration $n_{si}$ remaining in the single crystal, with the resistivity of at least $10^6\Omega\cdot$cm.

The above-described prior art methods have various disadvantages. In prior art 1, boron oxide is not used. Therefore, impurity contamination can be expected. Furthermore, since the amount of the carbon source cannot be controlled in this method, it is difficult to control the carbon concentration.

In prior art 2, carbon cannot be doped during the crystal growth since a carbon source is not used. There is a problem that the carbon concentration cannot be adjusted during crystal preparation. Furthermore, a part of the carbon in the GaAs melt reacts with oxygen, which is generated as a result of the water in the boron oxide decomposing, to be lost as CO gas. As a result, there is a problem that the carbon concentration in the GaAs crystal is lowered.

In prior art 3, it is difficult to control the carbon concentration since the carbon source is located outside the crucible. Furthermore, impurity contamination can be expected since boron oxide is not used.

In prior art 4, carbon is recited as the impurity serving as the acceptor. However, only the doping of zinc and copper is disclosed as the example. There is no description of carbon doping.

Prior art 5 describes a chromium-doped semi-insulating GaAs single crystal containing carbon. However, this prior art 5 is silent about the method of doping carbon.

SUMMARY OF THE INVENTION

In view of the foregoing, an object of the present invention is to provide a method of preparing, with high reproducibility, a carbon-doped group III–V compound semiconductor crystal having favorable electrical characteristics and having impurities removed therefrom, in which the amount of doped carbon can easily be adjusted during crystal growth.

One aspect of the present invention provides a method of preparing a group III–V compound semiconductor crystal. This method of preparing a group III–V compound semiconductor crystal having carbon doped therein includes the steps of: filling a crucible or boat with compound raw material, solid carbon, and boron oxide; sealing the crucible or boat filled with compound raw material, solid carbon, and boron oxide in an airtight vessel formed of a gas impermeable material; heating and melting the compound raw material in a sealed state in the airtight vessel; and solidifying the melted compound raw material to grow a carbon-doped compound semiconductor crystal.

Since the crucible or boat is filled with compound raw material, solid carbon, and boron oxide according to the present invention, the boron oxide softened by heating is brought into contact with at least a portion of the solid carbon in the state where the compound raw material is melted.

According to the present invention, the carbon concentration in the initial raw material does not have to be adjusted since carbon can be doped into the material during crystal growth. Good controllability of the carbon concentration is obtained. In other words, the target carbon concentration can be obtained with high reproducibility. By using boron oxide which has an impurity removal effect, the contamination of impurities in the crystal can be suppressed to obtain a crystal of favorable electrical characteristics.

Quartz or pBN (pyrolytic boron nitride) and the like can be enumerated as the gas impermeable material.

Preferably, the boron oxide contains water. This is because the water in boron oxide is essential to remove impurities. Furthermore, it is considered that the water in the boron oxide effects the incorporation of carbon into the crystal. The boron oxide preferably contains 10–500 wt ppm of water.

In the present invention, the amount of solid carbon to be filled into the crucible is preferably larger than the amount of carbon to be doped into the compound semiconductor crystal. This is to promote reaction using an excessive amount of carbon since the reaction rate of solid carbon is extremely low. Furthermore, an additional amount of carbon must be supplied to make up for the consumption of part of the solid carbon in gas generation of the carbon compound. Thus, by using solid carbon of an amount larger than the total amount of carbon doped into the crystal, the advantage of the present invention works effectively. Specifically, the amount of solid carbon must be at least ten times, preferably at least 100 times larger than the weight of the carbon doped into the crystal.

In the present invention, it is preferred that the solid carbon is subjected to a heat treatment under reduced pressure before being filled in the crucible or boat. By this process, any impurity element remaining in the carbon is removed to result in a crystal of higher purity. The pressure in applying the heat treatment to the carbon is preferably from 1 Torr to $1\times10^{-8}$ Torr. The appropriate temperature of the heat treatment is 500° C.–2000° C. The above-described effect can be obtained by carrying out the heat treatment for at least one hour. It was found that a greater effect can be obtained as the time for the heat treatment becomes longer. However, there is very little further change in the effect when the time for the heat treatment exceeds 12 hours. Considering that the cost for production is increased as the time for the heat treatment becomes longer, the time period for the heat treatment of not more than 12 hours is appropriate.

In the present invention, it is preferable to keep the compound raw material in its melted state for a certain time period before it is solidified for crystal growth. By this process, the impurities of Si and the like in the GaAs polycrystalline raw material can be removed by gettering with boron oxide. Although Si of approximately $1\times10^{16}cm^{-3}$ is included as impurities in the raw material synthesized by the HB method, the amount of Si in the GaAs subjected to the above-described process is less than $1\times10^{15}cm^{-3}$, which is below the detection limit of an analyzer. Si of an amount over $1\times10^{15}cm^{-3}$ was detected from those samples not subjected to the above-described process.

Thus, carbon can be sufficiently melted in the GaAs melt from the solid carbon by the above-described process. This process also provides the advantage that the temperature of the GaAs melt is stabilized, and the carbon concentration and impurity concentration in the melt can be made uniform.

The above-described effect can be obtained when the holding time period in the melted state of raw material is at least 3 hours. Further favorable characteristics can be obtained stably when the holding time is at least 6 hours. Although a greater effect can be obtained as the holding time becomes longer, the degree of change in the effect gradually becomes smaller when the holding time period exceeds 36 hours. There is very little further change in the effect when the holding time exceeds 72 hours. Considering that the cost for production becomes higher as the holding time is increased, the holding time is preferably not more than 72 hours, further preferably not more than 36 hours.

In the present invention, powder carbon can be used as the solid carbon. Powder carbon is advantageous in promoting the reaction due to its greater specific surface area. Increase in the reaction speed allows carbon to be doped efficiently in the crystal.

Also, the amount of carbon to be doped into the crystal can easily be adjusted according to the grain size, the weight, and the like, of the powder being used. For example, powder of a smaller grain size has a greater specific surface area to increase the reaction speed, whereby the amount of doped carbon is increased. Therefore, the grain size of the powder carbon is preferably smaller. More specifically, the average grain size is preferably not more than 100 μm, more preferably not more than 50 μm. When powder carbon is used, the powder carbon spreads in the boron oxide which is softened by heating in the state in which the compound raw material is melted.

In the present invention, fiber carbon, as well as powder carbon, can be used as the solid carbon. Fiber carbon is advantageous in that the diameter of the fiber is small and a greater surface area can be obtained to result in a faster reaction speed. It is therefore possible to dope carbon into the crystal efficiently. Also, the amount of carbon doped into the crystal can easily be adjusted according to the diameter or weight of the fiber that is used. Uniform distribution of the carbon concentration can be obtained from the shoulder to the tail of the prepared crystal when fiber carbon is used. The diameter of the fiber carbon is preferably smaller. Specifically, the average diameter is preferably not more than 50 μm, more preferably not more than 10 μm. Usage of fiber carbon allows carbon to spread in the boron oxide which is softened by heating in the state in which the compound raw material is melted. Also, the carbon can float above the boron oxide and thereby be exposed to the ambient.

In the present invention, bulk carbon can be used as the solid carbon, in addition to powder carbon and fiber carbon. Bulk carbon is advantageous in that the amount of carbon to be doped in the crystal can easily be adjusted by the weight and configuration of the carbon used. Uniform distribution of carbon concentration can be obtained from the shoulder to the tail of the prepared crystal when bulk carbon is used.

Bulk carbon is preferably used in a disk shape that is smaller than the inner diameter of the crucible. The amount of doped carbon can easily be controlled by the diameter of the disk. The bulk solid carbon is preferably a sintered compact of carbon powder. The reaction speed is particularly high for the sintered compact of powder having high porosity. Sintered carbon powder is advantageous in distributing carbon uniformly in the crystal. When bulk solid carbon is used, a state can be obtained in which at least a portion of the bulk solid carbon is immersed in the softened boron oxide.

In the present invention, the crucible or boat is preferably formed of pBN (pyrolytic boron nitride). Depending upon the constituent elements of the crucible or boat, there is a possibility that boron oxide or carbon reacts with the crucible and induces contamination of the raw material melt. pBN is most appropriate as the material of the crucible or boat to suppress reaction with boron oxide or carbon.

The present invention is particularly effective as a method of doping carbon into a GaAs crystal.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

EXAMPLE 1

Figure 1:
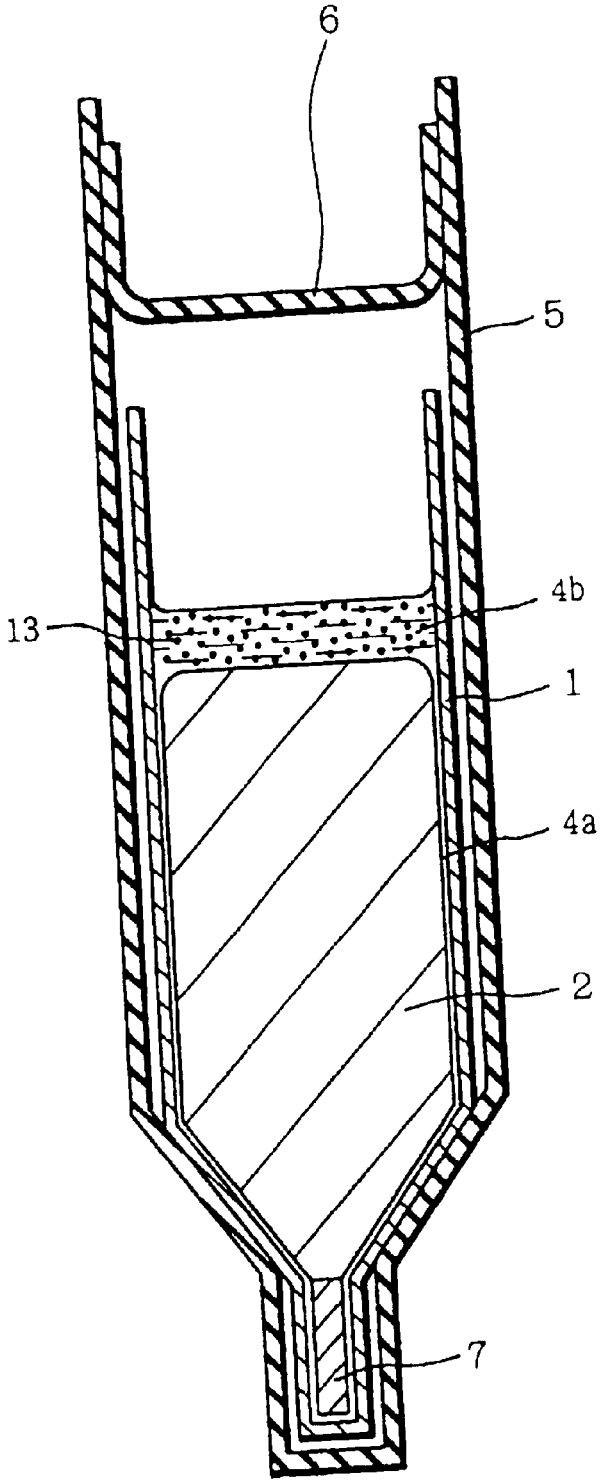
FIG. 1 is a diagram for describing an example of a method of preparing a group III–V compound semiconductor crystal according to the present invention.

FIG. 1 is a diagram for describing an example of preparing a group III–V compound semiconductor crystal according to the present invention. Referring to FIG. 1, GaAs polycrystalline raw material 2, carbon powder 13 which has been subjected to heat treatment under reduced pressure in advance, boron oxide ($B_2O_3$) 4 forming a boron oxide layer 4b and a boron oxide film 4a as described below, and a seed crystal 7 were placed in a pBN crucible 1. The seed crystal 7 was placed at the bottom portion of the crucible 1. In crucible 1, the materials were so arranged that carbon powder 13 and boron oxide 4 were brought into contact with each other, and also boron oxide 4 and raw material 2 were brought into contact with each other when the raw material was melted.

Crucible 1 was inserted in a quartz ampoule 5 together with solid arsenic. Ampoule 5 was sealed under reduced pressure with a quartz cap 6.

Respective conditions of Example 1 are shown in the following Table 1.

TABLE 1

| | |
|---|---|
| GaAs polycrystal (raw material) | 3 kg used |
| Carbon powder | 350 mesh (grain size 45 μm and below). 100 mg used Heat treatment at 1000° C. for 6 hours at the pressure of $10^{-2}$ Torr |
| $B_2O_3$ | Water concentration 50 wt ppm, 50 g used |
| pBN crucible | Inner diameter 80 mm, entire length 250 mm |
| Solid arsenic | 1 g used |

Figure 2:
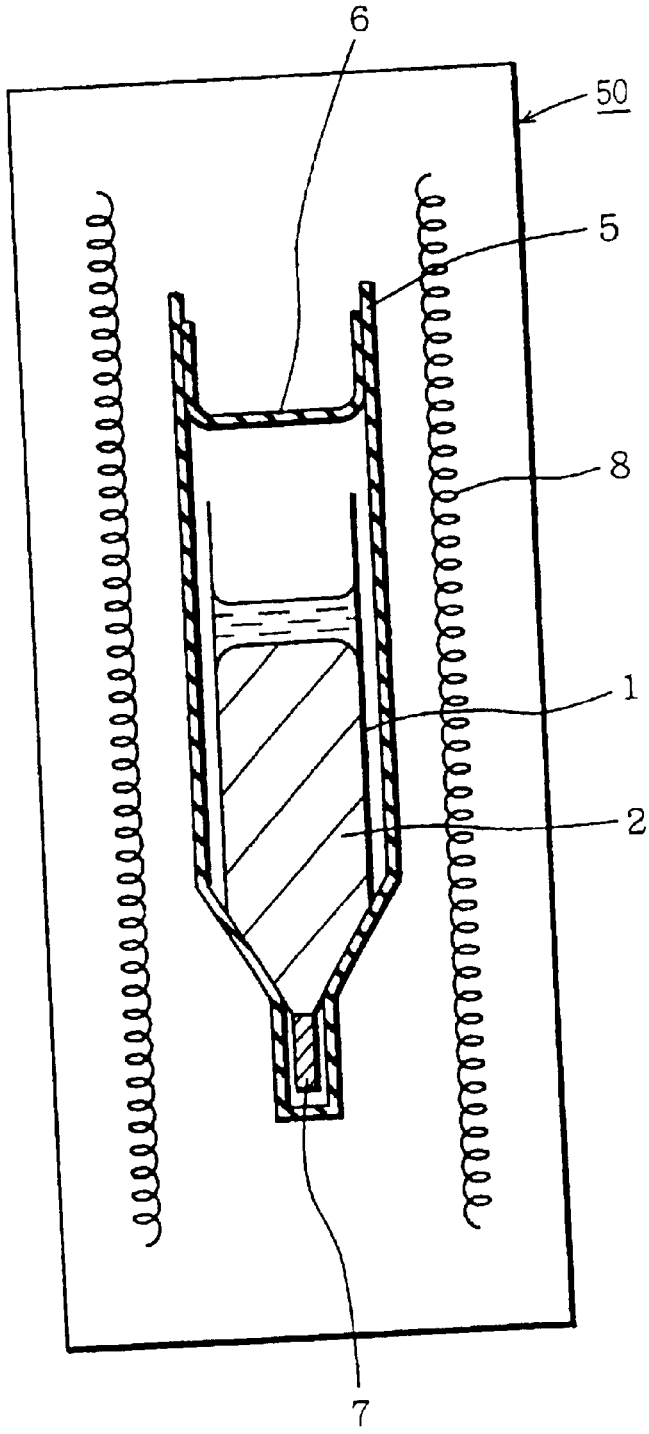
FIG. 2 is a diagram showing the state of carrying out crystal growth using a vertical furnace.

Referring to FIG. 2, the above-described quartz ampoule 5 was heated at the rate of approximately 200° C./hour by a heater 8 in a vertical furnace 50. During this process of heating, boron oxide 4 was softened and melted. Also, GaAs polycrystalline raw material 2 was melted. At this time point, boron oxide 4 was present as a film 4a having a thickness of less than 1 mm between pBN crucible 1 and GaAs raw material melt 2. The remainder of boron oxide 4 covered the upper surface of GaAs melt 2 as a boron oxide layer 4b having a thickness of approximately 5 mm. Carbon powder 13 was dispersed in this boron oxide layer 4b, as shown also in FIG. 1.

The condition mentioned above was maintained for approximately 36 hours. Then, heater 8 was moved upwards at the rate of 4 mm/hour, whereby solidification started from the portion of seed crystal 7. Thus, a single crystal was grown. The characteristics of the obtained single crystal are shown in the following Table 2.

TABLE 2

| | | |
|---|---|---|
| Crystal diameter | 80 mm | |
| Length of ϕ80 mm portion | 100 mm | |
| Carbon concentration | Shoulder | $1.4 \times 10^{15}$ cm$^{-3}$ |
| | Tail | $0.8 \times 10^{15}$ cm$^{-3}$ |
| Resistivity | Shoulder | $2.9 \times 10^{7}$ Ωcm |
| | Tail | $1.5 \times 10^{7}$ Ωcm |
| Dislocation density | Shoulder | 900 cm$^{-2}$ |
| | Tail | 1200 cm$^{-2}$ |

Figure 5:
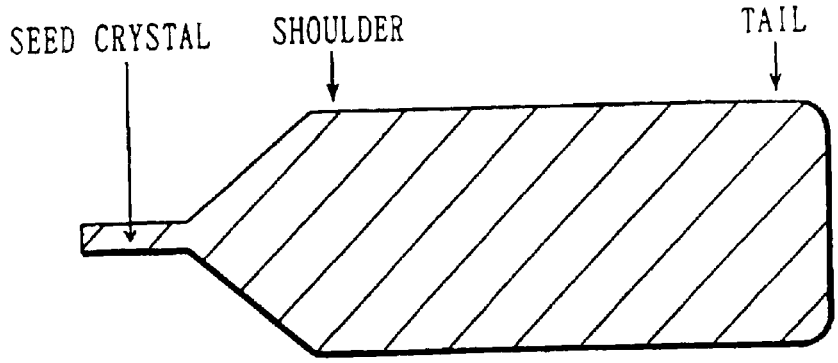
FIG. 5 is a diagram for describing each portion of a crystal.
Figure 6:
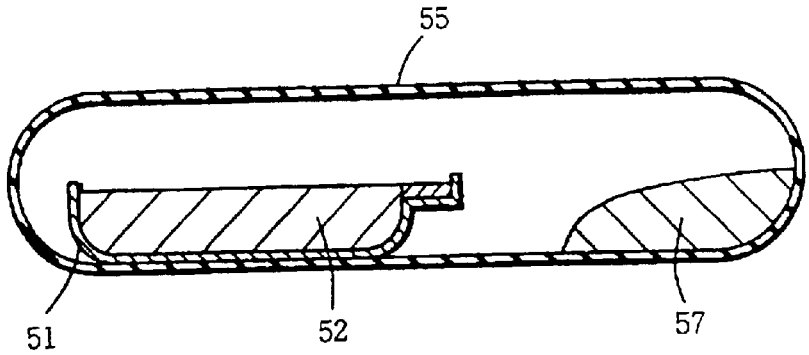
FIG. 6 PRIOR ART
FIG. 6 is a diagram for describing a method of preparing a carbon-doped group III–V compound semiconductor single crystal according to an example of prior art.
Figure 7:
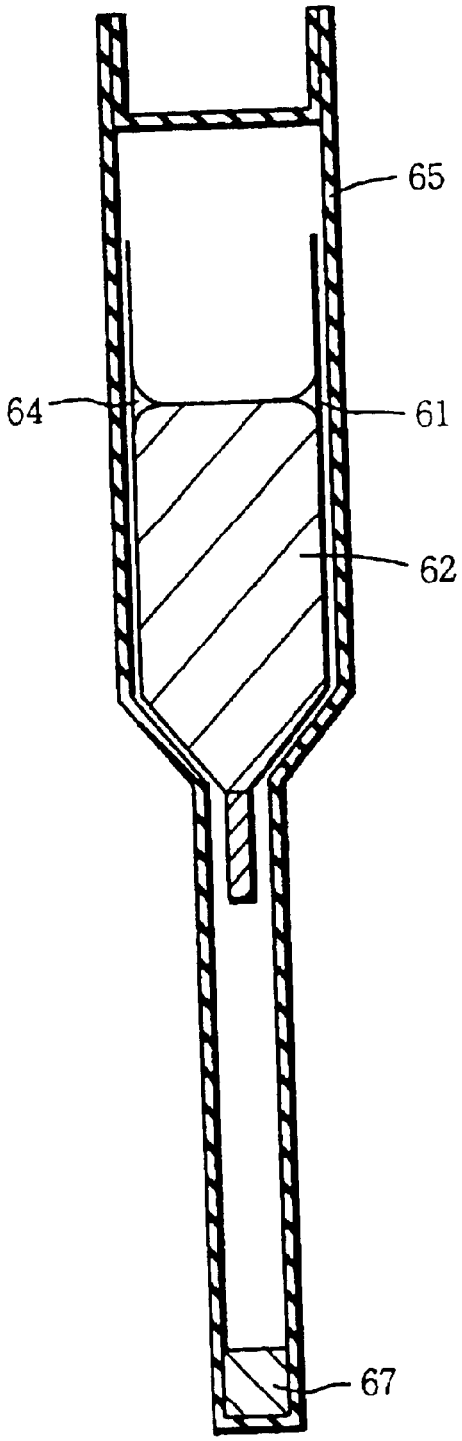
FIG. 7 PRIOR ART
FIG. 7 is a diagram for describing a method of preparing a carbon-doped group III–V compound semiconductor single crystal according to another example of prior art.
Figure 8:
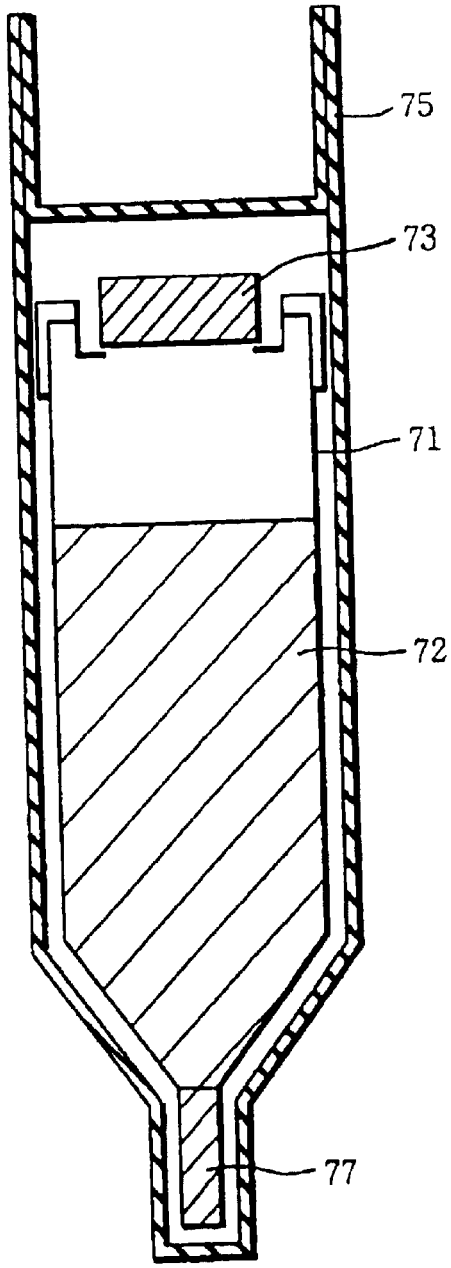
FIG. 8 PRIOR ART
FIG. 8 is a diagram for describing a method of preparing a carbon-doped group III–V compound semiconductor single crystal according to a further example of prior art.

In the present specification, the "shoulder" and "tail" of a crystal correspond to the relevant portions shown in FIG. 5.

The role of solid arsenic (As) sealed under reduced pressure in the quartz ampoule in the present example is set forth in the following. The dissociation pressure at the melting point of GaAs is approximately 1 atm. When GaAs is melted, the airtight vessel is filled with As vapor of approximately 1 atm at the temperature of the melting point.

This As vapor is generated as a result of the GaAs melt being decomposed. Therefore, the composition of the GaAs melt is shifted from the original composition of GaAs=1:1 to Ga rich composition. By sealing solid arsenic in the quartz ampoule in addition to GaAs, the shift from the composition of Ga:As=1:1 caused by decomposition of the GaAs melt can be suppressed.

EXAMPLE 2

Figure 3:
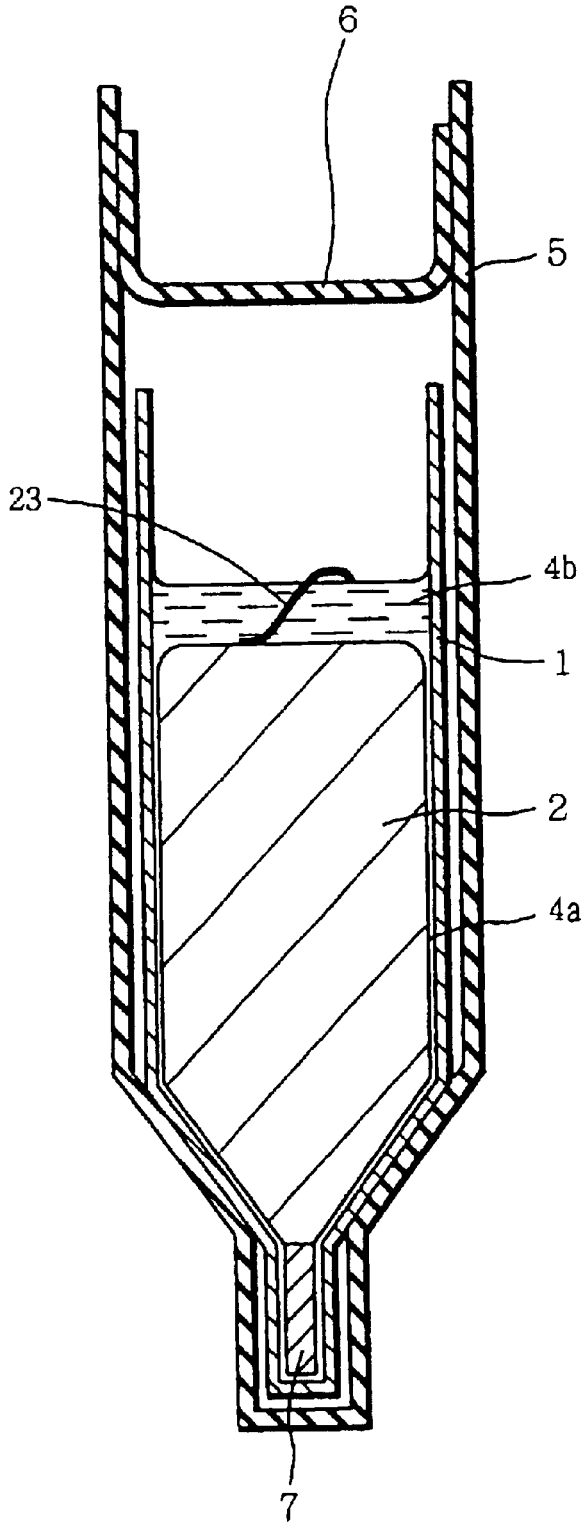
FIG. 3 is a diagram for describing another example of a method of preparing a group III–V compound semiconductor crystal according to the present invention.

FIG. 3 is a diagram for describing another example of a method of preparing a group III–V compound semiconductor crystal of the present invention. Referring to FIG. 3, GaAs polycrystalline raw material 2, carbon fiber 23 subjected to heat treatment under reduced pressure in advance, boron oxide 4 forming a boron oxide layer 4b and a boron oxide film 4a as described below, and a seed crystal 7 were placed in a pBN crucible 1. Seed crystal 7 was placed at the bottom portion of the crucible 1. In crucible 1, the materials were arranged so that carbon fiber 23 and boron oxide 4 were brought into contact with each other and also boron oxide 4 and raw material 2 were brought into contact with each other when the raw material was melted. Crucible 1 was inserted into a quartz ampoule 5 together with solid arsenic. Quartz ampoule 5 was sealed under reduced pressure with a quartz cap 6. Respective conditions of Example 2 are shown in the following Table 3.

TABLE 3

| | |
|---|---|
| GaAs polycrystal (raw material) | 10 kg used |
| Carbon fiber | Average diameter 5-8 μm, 40 mg used, Heat treatment at 800° C. for 3 hours at the pressure of $10^{-7}$ Torr |
| $B_2O_3$ | Water concentration 70 wt ppm, 100 g used |
| pBN crucible | Inner diameter 105 mm, entire length 400 mm |
| Solid arsenic | 1.5 g used |

Quartz ampoule 5 was heated at the rate of approximately 120° C./hour by a heater 8 in a vertical furnace 50, as shown in FIG. 2. During the process of heating, boron oxide 4 was softened and melted. Also, GaAs polycrystalline raw material 2 was melted. At this time point, boron oxide 4 was present as a film 4a having a thickness of not more than 1 mm between pBN crucible 1 and GaAs melt 2. The remainder of boron oxide 4 covered the upper surface of the GaAs melt 2 as a boron oxide layer 4b having a thickness of approximately 5 mm. The carbon fiber 23 was partially dispersed in boron oxide layer 4b on GaAs melt 2, and partially floated. Furthermore, a portion of carbon fiber 23 was present also at the proximity of the interface between GaAs melt 2 and boron oxide layer 4b.

Then, the condition mentioned above was maintained for approximately 12 hours. Then, heater 8 was moved upwards at the rate of 3 mm/hour, whereby solidification started from the portion of seed crystal 7. Thus, a single crystal was grown. The characteristics of the obtained single crystal are shown in the following Table 4.

TABLE 4

| | | |
|---|---|---|
| Crystal diameter | 105 mm | |
| Length of ϕ105 mm portion | 200 mm | |
| Carbon concentration | Shoulder | $6.5 \times 10^{15}$ cm$^{-3}$ |
| | Tail | $7.0 \times 10^{15}$ cm$^{-3}$ |
| Resistivity | Shoulder | $4.1 \times 10^{8}$ Ωcm |
| | Tail | $5.0 \times 10^{8}$ Ωcm |
| Dislocation density | Shoulder | 800 cm$^{-2}$ |
| | Tail | 1500 cm$^{-2}$ |

EXAMPLE 3

A carbon-doped GaAs single crystal was grown using 20 mg of carbon fiber similar to that of Example 2. The other conditions of the experiment were identical to those of Example 2, and their description will not be repeated. The characteristics of the obtained single crystal are shown in the following Table 5.

TABLE 5

| | | |
|---|---|---|
| Crystal diameter | 105 mm | |
| Length of ϕ105 mm portion | 200 mm | |
| Carbon concentration | Shoulder | $2.3 \times 10^{15}$ cm$^{-3}$ |
| | Tail | $2.2 \times 10^{15}$ cm$^{-3}$ |
| Resistivity | Shoulder | $8.8 \times 10^{7}$ Ωcm |
| | Tail | $8.4 \times 10^{7}$ Ωcm |
| Dislocation density | Shoulder | 1000 cm$^{-2}$ |
| | Tail | 1800 cm$^{-2}$ |

EXAMPLE 4

A carbon-doped GaAs single crystal was grown using 7.5 mg of carbon fiber similar to those of Examples 2 and 3. The other conditions were identical to those of Examples 2 and 3, and their description will not be repeated. The characteristics of the obtained single crystal are shown in the following Table 6.

TABLE 6

| | | |
|---|---|---|
| Crystal diameter | 105 mm | |
| Length of ϕ105 mm portion | 200 mm | |
| Carbon concentration | Shoulder | $1.3 \times 10^{15}$ cm$^{-3}$ |
| | Tail | $1.2 \times 10^{15}$ cm$^{-3}$ |
| Resistivity | Shoulder | $2.5 \times 10^{7}$ Ωcm |
| | Tail | $2.3 \times 10^{7}$ Ωcm |
| Dislocation density | Shoulder | 1500 cm$^{-2}$ |
| | Tail | 2000 cm$^{-2}$ |

It is appreciated from Examples 2, 3 and 4 that the carbon concentration in the crystal can easily be adjusted by just adjusting the amount of solid carbon to be doped according to the present invention.

EXAMPLE 5

Figure 4:
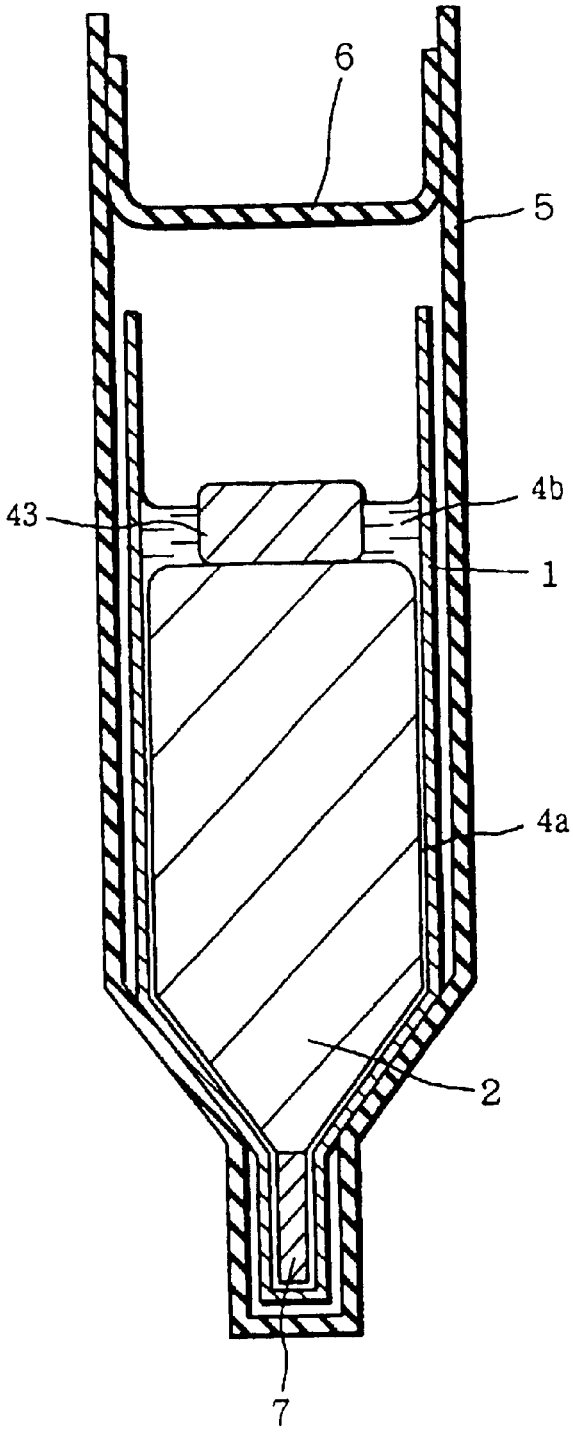
FIG. 4 is a diagram for describing a further example of a method of preparing a group III–V compound semiconductor crystal according to the present invention.

FIG. 4 is a diagram for describing another example of a method of preparing a group III–V compound semiconductor crystal according to the present invention. Referring to FIG. 4, GaAs polycrystalline raw material 2, a disk 43 made of sintered carbon powder subjected in advance to a heat treatment under reduced pressure, boron oxide 4 that will form a boron oxide layer 4b and a boron oxide film 4a as described below, and a seed crystal 7 were placed in a pBN crucible 1. Seed crystal 7 was placed at the bottom portion of the crucible 1. In crucible 1, the materials were arranged so that carbon disk 43 and boron oxide 4 were brought into contact with each other, and also boron oxide 4 and raw material 2 were brought into contact with each other when the raw material was melted.

This crucible 1 was inserted in a quartz ampoule 5 together with solid arsenic. Quartz ampoule 5 was sealed under reduced pressure using quartz cap 6. Respective conditions of example 5 are indicated in the following Table 7.

TABLE 7

| | |
|---|---|
| GaAs polycrystal (raw material) | 3 kg used |
| Carbon disk | Diameter 30 mm, thickness 10 mm used<br>Heat treatment at 1500° C. for 12 hours at the pressure of 1 Torr |
| $B_2O_3$ | Water concentration 300 wt ppm, 50 g used |
| pBN crucible | Inner diameter 80 mm, entire length 250 mm |
| Solid arsenic | 1 g used |

The above-described quartz ampoule 5 was heated at the rate of approximately 200° C./hour by heater 8 in a vertical furnace 50. During the process of heating, boron oxide 4 was softened and melted. Also, GaAs polycrystalline raw material 2 was melted. At this time point, boron oxide 4 was present as a film 4a having a thickness of less than 1 mm between pBN crucible 1 and GaAs melt 2. The remainder of boron oxide 4 covered the upper surface of GaAs melt 2 as a boron oxide layer 4b having a thickness of approximately 6 mm. Carbon disk 43 had its bottom surface in contact with raw material melt 2, and its top surface exposed to the ambient. The side surface thereof was surrounded by boron oxide layer 4b.

The condition mentioned above was maintained for approximately 6 hours. Then, heater 8 was moved upwards at the rate of 4 mm/hour, whereby solidification started from the portion of seed crystal 7. Thus, a single crystal was grown. The characteristics of the obtained single crystal are shown in the following Table 8.

TABLE 8

| | | |
|---|---|---|
| Crystal diameter | 80 mm | |
| Length of ϕ80 mm portion | 100 mm | |
| Carbon concentration | Shoulder | $6.8 \times 10^{15}$ cm$^{-3}$ |
| | Tail | $7.1 \times 10^{15}$ cm$^{-3}$ |
| Resistivity | Shoulder | $4.5 \times 10^{8}$ Ωcm |
| | Tail | $5.2 \times 10^{8}$ Ωcm |
| Dislocation density | Shoulder | 1200 cm$^{-2}$ |
| | Tail | 1500 cm$^{-2}$ |

In a semi-insulating GaAs crystal, the resistivity is one of the most important characteristics. It is preferable that variation in resistivity is smaller. Furthermore, since this resistivity value depends on the carbon concentration in the GaAs crystal, variation in the carbon concentration in the crystal should be as small as possible.

In the above-described examples where carbon fiber or bulk carbon was used as the solid carbon, the carbon was doped substantially uniformly from the shoulder to the tail of the crystal. It is appreciated that carbon fiber and bulk carbon are preferable as solid carbon sources. The shape of bulk carbon is not limited to the disk shape shown in Example 5, and any shape can be used. Also, bulk carbon is preferably a sintered compact of carbon powder.

Comparison of the effect of the present invention depending upon differences in the type of solid carbon is shown in the following Table 9.

TABLE 9

Difference in effect among powder, fiber, and bulk carbon

| Type of solid carbon | Carbon distribution in a crystal from shoulder to tail |
|---|---|
| Carbon powder | Gradual decrease of carbon from shoulder to tail |
| Carbon fiber | Uniform distribution of carbon from shoulder to tail |
| Bulk carbon | Uniform distribution of carbon from shoulder to tail |

Comparison of the carbon concentration in a GaAs crystal between the present invention and the prior art is shown in the following Table 10.

TABLE 10

Comparison of carbon concentration in GaAs crystal

| | | | Carbon concentration (cm$^{-3}$) | |
|---|---|---|---|---|
| | | | Shoulder | Tail |
| Present invention | Carbon powder | | $1.4 \times 10^{15}$ | $0.8 \times 10^{15}$ |
| | Carbon fiber | Example 2 | $6.5 \times 10^{15}$ | $7.0 \times 10^{15}$ |
| | | Example 3 | $2.3 \times 10^{15}$ | $2.2 \times 10^{15}$ |
| | | Example 4 | $1.3 \times 10^{15}$ | $1.2 \times 10^{15}$ |
| | Carbon disk | | $6.8 \times 10^{15}$ | $7.1 \times 10^{15}$ |
| Prior art | Prior art 2 | | $0.5 \times 10^{15}$ | $0.4 \times 10^{15}$ |
| | Prior art 3 | | $2.2 \times 10^{15}$ | $1.4 \times 10^{15}$ |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a carbon-doped group III–V compound semiconductor crystal, comprising the steps of:

placing a compound raw material, solid carbon, and a boron oxide substance into a crucible or a boat, sealing said crucible or boat containing said compound raw material, said solid carbon, and said boron oxide substance within an airtight vessel formed of a gas impermeable material, heating and melting said compound raw material in said crucible or said boat sealed within said airtight vessel, and solidifying said melted compound raw material to grow a carbon-doped compound semiconductor crystal, wherein an amount of said solid carbon placed into said crucible or said boat is larger than an amount of carbon doped into said compound semiconductor crystal.

2. The method of preparing a carbon-doped group III–V compound semiconductor crystal according to claim 1, further comprising a step of heating and melting said boron oxide substance and having said melted boron oxide substance in contact with at least a portion of said solid carbon, during said step of heating and melting said compound raw material.

3. The method of preparing a carbon-doped group III–V compound semiconductor crystal according to claim 1, wherein said gas impermeable material comprises a material selected from the group consisting of quartz and pBN.

4. The method of preparing a carbon-doped group III–V compound semiconductor crystal according to claim 1, wherein said boron oxide substance comprises boron oxide and water.

5. The method of preparing a carbon-doped group III–V compound semiconductor crystal according to claim 4, wherein said boron oxide substance contains 10–500 wt ppm of said water.

6. The method of preparing a carbon-doped group III–V compound semiconductor crystal according to claim 1, wherein said amount of said solid carbon placed into said crucible or said boat is at least 10 times larger than said amount of carbon doped into said compound semiconductor crystal.

7. The method of preparing a carbon-doped group III–V compound semiconductor crystal according to claim 1, further comprising a step of subjecting said solid carbon to a heat treatment under reduced pressure before placing said solid carbon into said crucible or said boat.

8. The method of preparing a carbon-doped group III–V compound semiconductor crystal according to claim 7, comprising carrying out said heat treatment for 1 hour to 12 hours at a temperature of 500° C.–2000° C. under a pressure of 1 Torr–$1\times10^{-8}$ Torr.

9. The method of preparing a carbon-doped group III–V compound semiconductor crystal according to claim 1, further comprising a step of maintaining said melted compound raw material in a melted state for a certain time period before said step of solidifying said melted raw material to grow said crystal.

10. The method of preparing a carbon-doped group III–V compound semiconductor crystal according to claim 9, wherein said step of maintaining said melted compound raw material in a melted state is carried out for 3–72 hours.

11. The method of preparing a carbon-doped group III–V compound semiconductor crystal according to claim 1, wherein said solid carbon comprises powder carbon.

12. The method of preparing a carbon-doped group III–V compound semiconductor crystal according to claim 11, wherein said powder carbon has a grain size of not more than 100 μm.

13. The method of preparing a carbon-doped group III–V compound semiconductor crystal according to claim 1, wherein said solid carbon comprises fiber carbon.

14. The method of preparing a carbon-doped group III–V compound semiconductor crystal according to claim 13, wherein said fiber carbon has an average diameter of not more than 50 μm.

15. The method of preparing a carbon-doped group III–V compound semiconductor crystal according to claim 1, wherein said solid carbon comprises bulk carbon.

16. The method of preparing a carbon-doped group III–V compound semiconductor crystal according to claim 15, wherein said bulk carbon has a disk shape with a disk diameter smaller than an inner diameter of said crucible.

17. The method of preparing a carbon-doped group III–V compound semiconductor crystal according to claim 15, wherein said bulk carbon comprises a sintered compact of carbon powder.

18. The method of preparing a carbon-doped group III–V compound semiconductor crystal according to claim 1, wherein said crucible or said boat comprises pBN.

19. The method of preparing a carbon-doped group III–V compound semiconductor crystal according to claim 1, wherein said compound raw material comprises GaAs, and wherein said compound semiconductor crystal comprises a GaAs crystal.

20. The method of preparing a carbon-doped group III–V compound semiconductor crystal according to claim 2, further comprising having said melted boron oxide substance in contact with at least a portion of said melted compound raw material, during said step of heating and melting said compound raw material.

21. The method of preparing a carbon-doped group III–V compound semiconductor crystal according to claim 1, further comprising selecting a target amount of said carbon to be doped into said compound semiconductor crystal, and adjusting said amount of said solid carbon placed into said crucible or said boat so as to responsively achieve said target amount of said carbon to be doped into said semiconductor crystal.

22. The method of preparing a carbon-doped group III–V compound semiconductor crystal according to claim 1, carried out such that said carbon-doped compound semiconductor crystal has a variation of carbon concentration of not more than 8⅓% between a lowest carbon concentration and a highest carbon concentration, relative to said lowest carbon concentration.

*23. Vertical boat growth of single crystal, semi-insulating GaAs ingots having controlled planned target levels of Carbon therein comprising: (a) loading a crucible with a charge of poly-crystal GaAs material; a source of carbon; and Boron Oxide over a selectively oriented seed crystal; (b) placing said crucible in a closed quartz tube; (c) applying a controlled pattern of heating to melt the charge and a portion of the seed crystal to sequentially freeze the melt starting at the interface with the seed crystal to form a single crystal; wherein said source of carbon is carbon powder in a selected quantity having a defined large nominal doping potential compared to the planned target level of Carbon in an as grown ingot; and said Boron Oxide is provided in an amount for providing spacer material between an as grown ingot and a crucible wall, and between a seed crystal and the bottom of said crucible.*

*24. Vertical boat growth of single crystal, semi-insulating GaAs ingots in accordance with claim 23 wherein said pattern of heating comprises: heating said charge to the melting point temperature of GaAs; holding that temperature for a period of time.*

*25. Vertical boat growth of single crystal, semi-insulating GaAs ingots in accordance with claim 23 wherein the nominal doping potential of said carbon powder included in the charge is the order of 100 times the planned target level of carbon dopant in an as grown ingot.*

*26. Vertical boat growth of single crystal, semi-insulating GaAs ingots in accordance with claim 23 wherein the nominal doping potential of said carbon powder included in the charge is at least several times the planned target level of carbon dopant in an as grown ingot.*

*27. The method of any of claims 1-22 wherein sufficient boron oxide substance is placed in said crucible or boat so that the boron oxide substance surrounds the melted semiconductor compound.*

*28. The method of claim 27 wherein said melting and solidifying is conducted in a vertical furnace.*

*29. The method of any of claims 1-22 wherein said melting and solidifying is conducted in a vertical furnace.*

*30. The method of any of claims 2-10 or 18-22 wherein said solid carbon is powdered carbon.*

*31. The method of claim 30 wherein sufficient boron oxide substance is placed in said crucible or boat so that the boron oxide substance surrounds the melted semiconductor compound.*

*32. The method of claim 30 wherein said melting and solidifying is conducted in a vertical furnace.*

*33. The method of any of claims 2-10 or 18-22 wherein said solid carbon is carbon fibers.*

*34. The method of claim 33 wherein sufficient boron oxide substance is placed in said crucible or boat so that the boron oxide substance surrounds the melted semiconductor compound.*

35. The method of claim 33 wherein said melting and solidifying is conducted in a vertical furnace.

36. A method of preparing a carbon-doped group III-V compound semiconductor comprising the steps of:

melting a boron oxide substance in contact with carbon, thereby forming a boron oxide-carbon mixture, heating and melting a III-V compound semiconductor raw material together with said boron oxide-carbon mixture in a boat, maintaining said compound raw material in melted form in said boat for a period to permit carbon to migrate from said boron oxide-carbon mixture into said compound raw material, and solidifying said melted compound raw material in said boat to form a crystalline carbon-doped compound semiconductor, wherein the amount of carbon in the initial boron oxide-carbon mixture is larger than the amount of carbon doped into said compound semiconductor.

37. The method of preparing a carbon-doped group III-V compound semiconductor according to claim 36, wherein said boron oxide substance comprises boron oxide and water.

38. The method of preparing a carbon-doped group III-V compound semiconductor according to claim 37, wherein said boron oxide substance contains 10-500 wt ppm of said water.

39. The method of preparing a carbon-doped group III-V compound semiconductor according to claim 36, wherein said amount of said carbon in contact with said melted boron oxide substance is at least 10 times larger than said amount of carbon doped into said crystalline semiconductor.

40. The method of preparing a carbon-doped group III-V compound semiconductor according to claim 36, further comprising a step of subjecting solid carbon to a heat treatment under reduced pressure before melting said boron oxide substance in contact with said carbon.

41. The method of preparing a carbon-doped group III-V compound semiconductor according to claim 40, comprising carrying out said heat treatment for 1 hour to 12 hours at a temperature of 500° C.-2000° C. under a pressure of 1 Torr-$1\times10^{-8}$ Torr.

42. The method of preparing a carbon-doped group III-V compound semiconductor according to claim 41, further comprising a step of maintaining said melted compound raw material in a melted state for a certain time period before said step of solidifying said melted raw material.

43. The method of preparing a carbon-doped group III-V compound semiconductor according to claim 42, wherein said step of maintaining said melted compound raw material in a melted state is carried out for 3-72 hours.

44. The method of preparing a carbon-doped group III-V compound semiconductor crystal according to claim 36, further comprising selecting a target amount of said carbon to be doped into said compound semiconductor crystal, and adjusting said amount of said carbon in contact with said melted boron oxide substance so as to responsively achieve said target amount of said carbon to be doped into said semiconductor crystal.

45. The method of preparing a carbon-doped group III-V compound semiconductor crystal according to claim 36, wherein said carbon comprises powder carbon.

46. The method of preparing a carbon-doped group III-V compound semiconductor crystal according to claim 38, wherein said carbon comprises powder carbon.

47. The method of preparing a carbon-doped group III-V compound semiconductor crystal according to claim 36, wherein said carbon comprises fiber carbon.

48. The method of preparing a carbon-doped group III-V compound semiconductor crystal according to claim 38, wherein said carbon comprises fiber carbon.

49. The method of preparing a carbon-doped group III-V compound semiconductor crystal according to claim 36, wherein said compound raw material comprises GaAs, and wherein said compound semiconductor crystal comprises a single crystal of GaAs.

50. The method of preparing a carbon-doped group III-V compound semiconductor crystal according to claim 49, carried out such that said carbon-doped compound semiconductor crystal has a variation of carbon concentration of not more than 8⅓% between a lowest carbon concentration and a highest carbon concentration, relative to said lowest carbon concentration.

51. The method of preparing a carbon-doped group III-V compound semiconductor crystal according to claim 49, wherein said boron oxide substance comprises boron oxide and water.

52. The method of preparing a carbon-doped group III-V compound semiconductor crystal according to claim 51, wherein said boron oxide substance contains 10-500 wt ppm of said water.

53. The method of preparing a carbon-doped group III-V compound semiconductor crystal according to claim 49, wherein said amount of said carbon in contact with said melted boron oxide substance is at least 10 times larger than said amount of carbon doped into said compound semiconductor crystal.

54. The method of preparing a carbon-doped group III-V compound semiconductor crystal according to claim 49, further comprising a step of subjecting solid carbon to a heat treatment under reduced pressure before melting said boron oxide substance in contact with said carbon.

55. The method of preparing a carbon-doped group III-V compound semiconductor crystal according to claim 54, comprising carrying out said heat treatment for 1 hour to 12 hours at a temperature of 500° C.-2000° C. under a pressure of 1 Torr-$1\times10^{-8}$ Torr.

56. The method of preparing a carbon-doped group III-V compound semiconductor crystal according to claim 49, further comprising a step of maintaining said melted compound raw material in a melted state for a certain time period before said step of solidifying said melted raw material to grow said crystal.

57. The method of preparing a carbon-doped group III-V compound semiconductor crystal according to claim 51, wherein said step of maintaining said melted compound raw material in a melted state is carried out for 3-72 hours.

58. The method of preparing a carbon-doped group III-V compound semiconductor crystal according to claim 49, further comprising selecting a target amount of said carbon to be doped into said compound semiconductor crystal, and adjusting said amount of said carbon in contact with said melted boron oxide substance so as to responsively achieve said target amount of said carbon to be doped into said semiconductor crystal.

59. The method of preparing a carbon-doped group III-V compound semiconductor crystal according to claim 49, wherein said carbon comprises powder carbon.

60. The method of preparing a carbon-doped group III-V compound semiconductor crystal according to claim 52, wherein said carbon comprises powder carbon.

61. The method of preparing a carbon-doped group III-V compound semiconductor crystal according to claim 49, wherein said carbon comprises fiber carbon.

62. The method of preparing a carbon-doped group III-V compound semiconductor crystal according to claim 52, wherein said carbon comprises fiber carbon.

*63. The method of preparing a carbon-doped group III-V compound semiconductor according to claim 36, further comprising a step of maintaining said melted compound raw material in a melted state for a certain time period before said step of solidifying said melted raw material.*

*64. The method of preparing a carbon-doped group III-V compound semiconductor crystal according to claim 39, wherein said carbon comprises powder carbon.*

*65. The method of preparing a carbon-doped group III-V compound semiconductor crystal according to claim 39, wherein said carbon comprises fiber carbon.*

*66. The method of preparing a carbon-doped group III-V compound semiconductor crystal according to claim 53, wherein said carbon comprises powder carbon.*

*67. The method of preparing a carbon-doped group III-V compound semiconductor crystal according to claim 53, wherein said carbon comprises fiber carbon.*

*68. A method of preparing a carbon-doped group III-V compound semiconductor comprising the steps of:*

*melting a boron oxide substance in contact with carbon, thereby forming a boron oxide-carbon mixture,*

*heating and melting a III-V compound semiconductor raw material together with said boron oxide-carbon mixture,*

*maintaining said compound raw material in melted form for a period to permit carbon to migrate from said boron oxide-carbon mixture into said compound raw material, and*

*solidifying said melted compound raw material to form a crystalline carbon-doped compound semiconductor,*

*wherein the amount of carbon in the initial boron oxide-carbon mixture is larger than the amount of carbon doped into said compound semiconductor,*

*further comprising a step of subjecting said carbon to a heat treatment under reduced pressure before melting said boron oxide substance in contact with said carbon.*

*69. The method of preparing a carbon-doped group III-V compound semiconductor according to claim 68, comprising carrying out said heat treatment for 1 hour to 12 hours at a temperature of 500° C.-2000° C. under a pressure of 1 Torr-$1\times10^{-8}$ Torr.*

*70. The method of preparing a carbon-doped group III-V compound semiconductor according to claim 69, further comprising a step of maintaining said melted compound raw material in a melted state for a certain time period before said step of solidifying said melted raw material.*

*71. The method of preparing a carbon-doped group III-V compound semiconductor according to claim 70, wherein said step of maintaining said melted compound raw material in a melted state is carried out for 3-72 hours.*

*72. A method of preparing a carbon-doped group III-V compound semiconductor comprising the steps of:*

*melting a boron oxide substance in contact with fiber carbon, thereby forming a boron oxide-carbon mixture,*

*heating and melting a III-V compound semiconductor raw material together with said boron oxide-carbon mixture,*

*maintaining said compound raw material in melted form for a period to permit carbon to migrate from said boron oxide-carbon mixture into said compound raw material, and*

*solidifying said melted compound raw material to form a crystalline carbon-doped compound semiconductor,*

*wherein the amount of carbon in the initial boron oxide-carbon mixture is larger than the amount of carbon doped into said compound semiconductor.*

*73. The method of preparing a carbon-doped group III-V compound semiconductor according to claim 72, wherein said boron oxide substance contains 10-500 wt ppm of said water.*

*74. The method of preparing a carbon-doped group III-V compound semiconductor according to claim 72, wherein said amount of said fiber carbon in contact with said melted boron oxide substance is at least 10 times larger than said amount of carbon doped into said crystalline semiconductor.*

*75. The method of preparing a carbon-doped group III-V compound semiconductor crystal according to claim 72, wherein said compound raw material comprises GaAs, and wherein said compound semiconductor crystal comprises a single crystal of GaAs.*

*76. The method of preparing a carbon-doped group III-V compound semiconductor crystal according to claim 75, wherein said boron oxide substance contains 10-500 wt ppm of said water.*

*77. The method of preparing a carbon-doped group III-V compound semiconductor crystal according to claim 75, wherein said amount of said fiber carbon in contact with said melted boron oxide substance is at least 10 times larger than said amount of carbon doped into said compound semiconductor crystal.*

* * * * *

UNITED STATES PATENT AND TRADEMARK OFFICE

CERTIFICATE OF CORRECTION

PATENT NO. : RE 39,778 E
APPLICATION NO. : 09/824965
DATED : August 21, 2007
INVENTOR(S) : Kawase et al.

It is certified that error appears in the above-identified patent and that said Letters Patent is hereby corrected as shown below:

At col. 1, line 8, insert the following:

*This application is a reissue of 08/843,124 filed April 25, 1997, now U.S. Patent 6,007,622.*

Signed and Sealed this

Eighth Day of April, 2008

JON W. DUDAS
*Director of the United States Patent and Trademark Office*